(12) United States Patent
Fitzgerald

(10) Patent No.: US 6,593,191 B2
(45) Date of Patent: Jul. 15, 2003

(54) BURIED CHANNEL STRAINED SILICON FET USING A SUPPLY LAYER CREATED THROUGH ION IMPLANTATION

(75) Inventor: Eugene A. Fitzgerald, Windham, NH (US)

(73) Assignee: Amberwave Systems Corporation, Salem, NH (US)

( * ) Notice: Subject to any disclaimer, the term of this patent is extended or adjusted under 35 U.S.C. 154(b) by 0 days.

(21) Appl. No.: 09/859,137

(22) Filed: May 16, 2001

(65) Prior Publication Data

US 2002/0052084 A1 May 2, 2002

Related U.S. Application Data

(60) Provisional application No. 60/207,382, filed on May 26, 2000.

(51) Int. Cl.$^7$ .............................................. H01L 21/336
(52) U.S. Cl. ..................... 438/282; 438/172; 438/275; 438/933; 257/19; 257/190; 257/191; 257/194; 257/205; 257/392
(58) Field of Search ................................. 438/172, 282, 438/275, 933; 257/19, 190, 191, 194, 205, 392

(56) References Cited

U.S. PATENT DOCUMENTS

| | | | | |
|---|---|---|---|---|
| 5,155,571 A | * | 10/1992 | Wang et al. ................... 257/19 |
| 5,241,197 A | | 8/1993 | Murakami et al. ........... 257/192 |
| 5,316,958 A | | 5/1994 | Meyerson .................... 437/31 |
| 5,426,316 A | | 6/1995 | Mohammad ................. 257/197 |
| 5,442,205 A | | 8/1995 | Brasen et al. ................ 257/191 |
| 5,461,250 A | | 10/1995 | Burghartz et al. ........... 257/347 |
| 5,523,243 A | | 6/1996 | Mohammad ................... 437/31 |
| 5,698,869 A | | 12/1997 | Yoshimi et al. .............. 257/192 |
| 5,705,847 A | * | 1/1998 | Kashiwa et al. ............. 257/476 |
| 5,906,951 A | | 5/1999 | Chu et al. .................... 438/751 |
| 5,912,479 A | | 6/1999 | Mori et al. ................... 257/192 |
| 6,350,993 B1 | * | 2/2002 | Chu et al. ...................... 257/19 |

OTHER PUBLICATIONS

Maiti et al., "Strained–Si Heterostructure Field Effect Transistors," *Semiconductor Science and Technology*, vol. 13, No. 11, Nov. 1, 1998, pp. 1225–1246.

König et al., "Design Rules for $n$–Type SiGe Hetero FETs," *Solid–State Electronics*, vol. 41, No. 10, Oct. 1, 1997, pp. 1541–1547.

(List continued on next page.)

*Primary Examiner*—Amir Zarabian
*Assistant Examiner*—Christy Novacek
(74) *Attorney, Agent, or Firm*—Testa, Hurwitz & Thibeault, LLP

(57) ABSTRACT

A method of fabricating a buried channel FET including providing a relaxed SiGe layer on a substrate, providing a channel layer on the relaxed SiGe layer, providing a SiGe cap layer on the channel layer, and ion implanting a dopant supply. The dopant supply can be ion implanted in either the SiGe cap layer or the relaxed SiGe layer. In another embodiment, there is provided a method of fabricating a circuit including providing at least one strained channel, enhancement mode FET, and at least one strained channel, depletion mode FET on a substrate, and ion implanting a dopant supply in the depletion mode FET.

43 Claims, 12 Drawing Sheets

OTHER PUBLICATIONS

Schäffler, "High–Mobility Si and Ge Structures," *Semiconductor Science and Technology*, vol. 12, No. 12, Dec. 1, 1997, pp. 1515–1549.

Welser et al., "Electron Mobility Enhancement in Strained–Si N–Type Metal–Oxide–Semiconductor Field–Effect Transistors," *IEEE Electron Device Letters*, vol. 15, No. 3, Mar. 1, 1994, pp. 100–102.

Mizuno et al., "High Performance Strained–Si p–MOSFETs on SiGe–on–Insulator Substrates Fabricated by SIMOX Technology," *International Electron Devices Meeting, IEEE Inc.*, Dec. 5–8, 1999, pp. 934–936.

Welser, et al.,"NMOS and PMOS Transistors Fabricated in Strained Silicon/Relaxed Silicon–Germanium Structures", Electron Devices Meeting, 1992., Technical Digest, International , pp. 1000–1002, Dec. 13–16, 1992.*

Ismail, K., "Si/SiGe High–Speed Field–Effect Transistors", Electron Devices Meeting, 1995., International, pp. 509–512, Dec. 10–13, 1995.*

Ismail, et al., "Integrated Enhancement– and Depletion–Mode FET's in Modulation–Doped Si/SiGe Heterostructures", IEEE Electron Device Letters, vol. 18, Issue 9, pp. 435–437, Sep. 1997.*

* cited by examiner

US 6,593,191 B2

BURIED CHANNEL STRAINED SILICON FET USING A SUPPLY LAYER CREATED THROUGH ION IMPLANTATION

PRIORITY INFORMATION

This application claims priority from provisional application Ser. No. 60/207,382 filed May 26, 2000.

BACKGROUND OF THE INVENTION

The invention relates to the field of buried channel strained-Si FETs, and in particular to these FETs using a supply layer created through ion implantation.

The advent of relaxed SiGe alloys on Si substrates introduces a platform for the construction of new Si-based devices. These devices have the potential for wide application due to the low cost of using a Si-based technology, as well as the increased carrier mobility in strained layers deposited on the relaxed SiGe.

As with most new technologies, implementing these advances in a Si CMOS fabrication facility requires additional innovation. For example, some of the potential new devices are more easily integrated into current Si processes than other devices. Since process technology is directly relevant to architecture, particular innovations in process technology can allow the economic fabrication of new applications/architectures.

FIGS. 1A and 1B are schematic block diagrams showing the variety of strained Si devices that are possible to fabricate given the advent of relaxed SiGe buffer layers. FIG. 1A shows a surface channel strained Si MOSFET 100. In this configuration, a tensile, strained Si channel 102 is deposited on relaxed SiGe layer 104 with a Ge concentration in the range of 10–50%. This relaxed SiGe layer is formed on a Si substrate 108 through the use of a compositionally graded SiGe buffer layer 106. A conventional MOS gate stack 110 is on the strained silicon channel and consists of an oxide layer 112, a poly-Si electrode 114, and a metal contact layer 116. Doped source 118 and drain 120 regions are also formed on either side of the gate stack to produce the MOSFET device structure.

A buried channel strained Si high electron mobility transistor (HEMT) 130 is shown in FIG. 1B. In this configuration, the strained Si 102 atop the relaxed SiGe 104 has been capped with a thin SiGe cap layer 132. The strained Si layer generally has a thickness between 2–30 nm, while the SiGe cap layer has a thickness between 2–20 nm. A metal Schottky gate 134 on the SiGe cap layer is commonly used on the HEMT, and, as in the MOSFET structure, doped source 118 and drain 120 regions are formed on each side of this gate.

FIG. 1C shows a buried channel strained Si MOSFET 140. This device has the same Si/SiGe layer structure as the HEMT configuration, but with a full MOS gate stack 142, consisting of oxide 144, poly-Si 146, and metal 148 layers, rather than the metal Schottky gate.

It is important to separate these devices into two categories, surface channel devices, of which an embodiment is shown in FIG. 1A, and buried channel devices, of which embodiments are shown in FIGS. 1B and 1C. In the case of the surface channel device, a light background doping in the SiGe during epitaxial growth or by implantation is sufficient to position the Fermi level such that a MOSFET constructed from the strained surface channel has reasonably large threshold values. Thus, the surface can be inverted for either p or n channel operation.

FIGS. 2A and 2B are the energy band diagram for the case of the surface channel FET for an NMOS device, (A) at zero bias, and (B) at a bias to turn on the transistor, respectively. When the transistor is turned on, a relatively large electric field exists in the normal direction to the surface plane, and the electrons are attracted to the surface and operate in the strained Si surface channel. The speed of the transistor is increased due to the fact that the electrons reside in the high mobility, strained Si surface channel. However, the device has noise performance similar to a conventional Si MOSFET since the carriers scatter off the $SiO_2$/Si interface, and the device, although it possesses a mobility larger than that of a conventional Si device, still has a mobility that is limited by the $SiO_2$/Si interface.

However, it is known from III–V materials that a buried channel device should possess a much higher electron mobility and lower noise performance. For example, the structures shown in FIGS. 1B and C should have higher channel mobility and lower noise performance than the device in FIG. 1A since the electron scatters off a semiconductor interface instead of an oxide interface.

A crucial flaw in the device shown in FIG. 1C that leads to processing difficulties and limitations in circuit layout and architectures is that when the device is biased to invert the channel and turn the device on, the band structure is such that many of the carriers leave the buried channel. FIG. 3 is an energy band diagram showing schematically the problem with a buried channel device in which there is no dopant supply layer. The field required to turn on the device empties the buried channel. This effectively creates a surface channel device even though the buried channel layer is present in the heterostructure.

The applied gate bias of FIG. 3 has bent the bands such that many of the electrons from the well escape confinement and create an inversion layer at the oxide/semiconductor interface. Since transconductance of a field effect device is high if the mobility and the number of carriers is high, a high performance FET, i.e., even higher performance than the surface channel device, is difficult to achieve. At low vertical fields, the electrons are in the high mobility buried channel, but there are few in number. If the device is turned on and inverted as shown in FIG. 3, the carrier density in the surface channel is high but the mobility is reduced since the carriers are now at the rough oxide interface.

One way to solve this problem is to insert a dopant supply layer into the structure, as shown in FIG. 4A. FIG. 4A is a schematic block diagram of a structure 400 in which the buried channel can be occupied with a high density of electrons via the insertion of a layer of donor atoms. It will be appreciated that an equivalent schematic can be constructed for a buried hole channel with a layer of acceptor atoms.

The structure 400 includes a strained Si channel 402 positioned between two SiGe layers, a relaxed SiGe layer 404 and a thin SiGe cap layer 406. Although FIG. 4A shows a dopant supply layer 408 in the SiGe cap, the dopants can be introduced into either SiGe layer. As has been shown in the III–V buried channel devices, this layer configuration creates a band structure where now the buried channel is occupied, as shown in FIG. 4B. In this figure, the supply layer leads to localized band bending and carrier population of the buried strained Si. In the strained Si, the conduction band has been lowered beneath the Fermi level, resulting in a high carrier density in the high mobility channel. One disadvantage of this structure is that now the transistor is on without any applied voltage, and a voltage is supplied to the gate to turn off the transistor. Thus, this transistor is normally on or depletion-mode. As a result, the device is useful in analog and logic applications, but is not easily implemented in a conventional CMOS architecture.

Common accepted practice in the buried channel heterostructure FETs is to use a dopant supply layer that is introduced in an epitaxial step, i.e., deposited during the epitaxial process that creates the Si/SiGe device structure. This dominant process originates from the III–V research device community (AlGaAs/GaAs materials system). However, this epitaxial dopant supply layer is undesirable since it reduces thermal budget and limits the variety of devices available in the circuit. For example, if the dopant supply layer is introduced in the epitaxial step, when processing begins, the thermal budget is already constrained due to diffusion of the supply layer dopants. All devices in the circuit must also now be buried channel devices with similar thresholds, since any removal of the dopant layer in a particular region would require complete etching of the local area and removal of critical device regions.

SUMMARY OF THE INVENTION

In accordance with the invention, there is provided a device structure that allows not only the creation of a low-noise, high frequency device, but also a structure that can be fabricated using conventional processes such as ion implantation. The use of ion implantation to create a carrier supply layer also allows great flexibility in creating different types of strained Si devices within the same circuit.

Accordingly, the invention provides a method of fabricating a buried channel FET including providing a relaxed SiGe layer on a substrate, providing a channel layer on the relaxed SiGe layer, providing a SiGe cap layer on the channel layer, and ion implanting dopant supply. The dopant supply can be ion implanted in either the SiGe cap layer or the relaxed SiGe layer. In another embodiment, there is provided a method of fabricating a circuit including providing at least one strained channel, enhancement mode FET, and at least one strained channel, depletion mode FET on a substrate, and ion implanting a dopant supply in the depletion mode FET.

DETAILED DESCRIPTION OF THE INVENTION

Fortunately, there is a solution to the problems described heretofore if one resists following the traditional path for dopant introduction in III–V buried channel devices. In the III–V materials, the dopant supply layer is introduced in the epitaxial step since there is no other known method.

In Si, it is well known that ion implantation can be used to create source/drain regions, and that annealing cycles can be used to remove the damage of such an implantation. FIGS. 5A–5I show a process flow in which ion implantation is used to create a buried channel device with an ion implanted dopant supply layer. The implanted layer can be an n-type dopant, such as phosphorus (P), arsenic (As), or antimony (Sb), or a p-type dopant, such as boron (B), gallium (Ga), or indium (In). The main features of the process depicted in FIG. 5 are described below. Note that this process flow is only an example of how the dopant supply layer can be used in combination with a conventional Si process flow to yield new devices and device combinations. This particular process flow was chosen since it is simple, and produces a depletion-mode buried strained channel device that has use in analog applications.

Figure 5A:
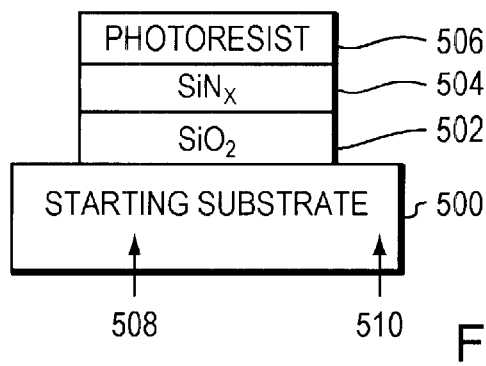
FIGS. 5A–5I show a process flow in which ion implantation is used to create a buried channel device with an ion implanted dopant supply layer.
Figure 5B:
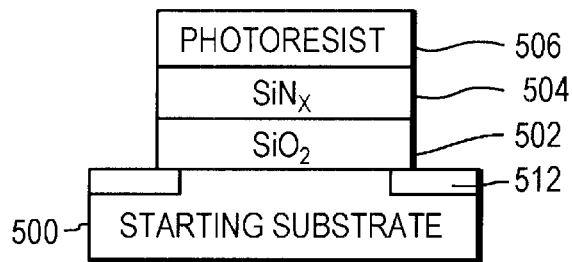

The process flow in FIG. 5A starts with a field oxidation process. Although this type of isolation can be convenient for larger gate sizes, it should be realized that at shorter gate lengths, trench isolation is preferable. FIG. 5A shows the starting substrate 500 after deposition of the $SiO_2$ 502 and a $SiN_x$ hardmask 504, and definition of the active area 508 and field areas 510 with a photoresist 506 and etch. In order to prevent biasing from creating of conduction paths below the field oxide, a channel-stop implant 512 is performed before the field oxidation using the photoresist, $SiO_2$ and $SiN_x$ as a mask, as shown in FIG. 5B.

Figure 5C:
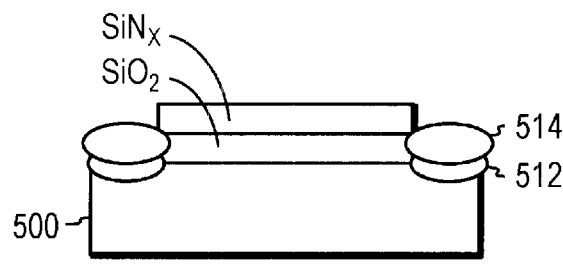
Figure 5D:
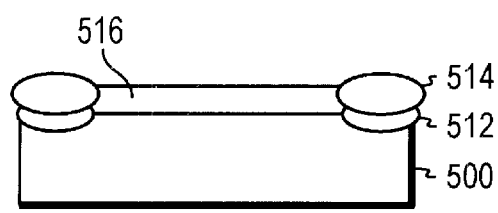
Figure 5E:
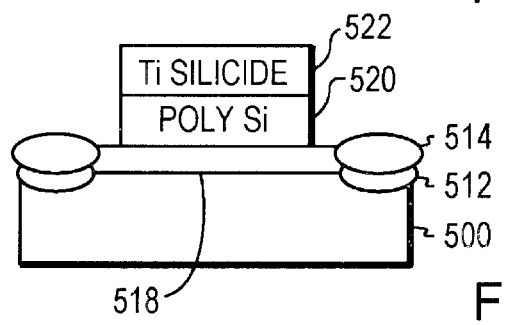

Subsequently, the photoresist is removed and a field oxide 514 is grown. FIG. 5C shows the device structure after completion of the field oxidation step. The field area has been oxidized, and the $SiO_2/SiN_x$ hardmask is still present above the device active area. After stripping the field oxide hardmask materials and creating a sacrificial oxide 516, as shown in FIG. 5D, the sacrificial oxide is stripped and gate oxidation is performed. In the heterostructures described, the strained Si channel in the surface channel MOSFET can be oxidized directly. For buried channel structures, a thin sacrificial Si layer must be present on the surface for oxidation since oxidizing SiGe directly tends to create a high interface state density. Polysilicon 520 deposition atop the gate oxide 518 completes the deposition of the gate stack of the MOSFET. For reduced gate resistance, a titanium silicide 522 can be formed before the gate etch, to reduce the resistance to the gate for RF and other high-speed applications. FIG. 5E depicts the formation of this silicided gate stack after deposition of polysilicon, deposition of titanium, and reaction of the titanium to form the silicide.

Figure 5F:
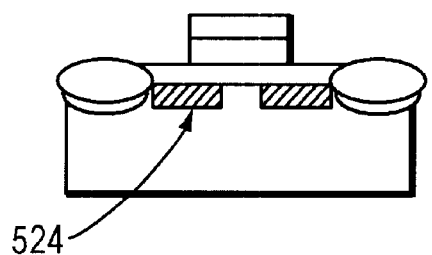
Figure 5G:
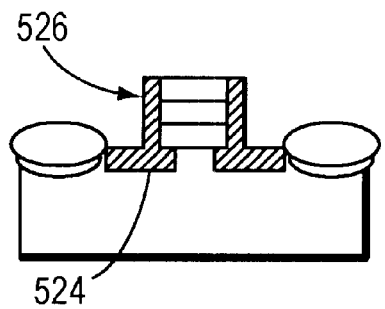
Figure 5H:
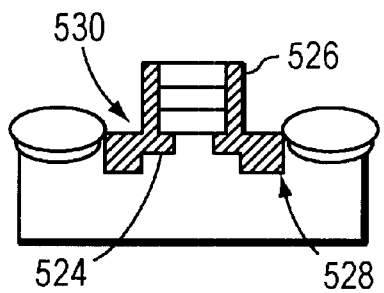
Figure 5I:
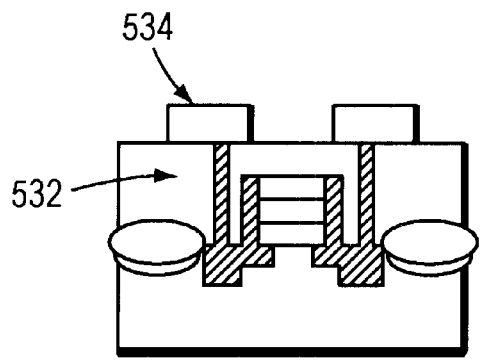

The key dopant supply layer implant can be done before or after the gate oxidation step. A shallow implant is performed in order to place the dopants near the strained Si channel layer. In the exemplary sequence, the dopant supply layer is implanted through the sacrificial oxide indicated in FIG. 5D. In that way, the sacrificial oxide can be stripped after implant, allowing a re-oxidation for achieving the highest gate oxide quality. FIGS. 5F–5I show the remainder of the process, which is standard Si CMOS processing. FIG. 5F shows the device structure after ion implantation of source-drain extensions 524. Next, $SiO_2/SiN_x$ spacers 526 are formed by deposition and an anisotropic etch, resulting in the structure pictured in FIG. 5G. Afterward, the deep source-drain ion implants 528 are performed, and the source-drain regions are silicided, as shown in FIG. 5H. The source-drain silicide 530 is typically formed via metal deposition, annealing, and removal of unreacted metal. Finally the interlayer dielectric, in this case $SiO_2$ 532 is deposited over the entire device structure. Contact cuts to the source, drain, and gate are etched away, and the first metallization layer 534 is deposited. FIG. 5I shows the device after the completion of all of the process steps.

It will be appreciated that one objective of the invention, and the process in general, is to inject the advantages of strained-Si technology into the current Si manufacturing infrastructure. The further one deviates from these typical Si processes, the less impact the strained-Si will have. Thus, by utilizing the implanted dopant supply layer described herein, the device design capability is increased, and manufacturability is improved. If the dopant supply layer were created by the conventional method of doping during epitaxial growth, the flexibility would be less, leading to non-typical architectures, different manufacturing processes, and procedures that differ much more significantly from typical process flows. The flow described in FIGS. 5A–5I is compatible with current Si VLSI processing and thus is more likely to have widespread impact.

As one can see with the above process, the goals of creating a new Si-based device are achieved by producing a highly populated buried channel, yet the dopants were not inserted at the very beginning of the process through epitaxy. Although ion implantation may not produce a dopant profile that is as abrupt as a profile created through epitaxy, and thus the electron mobility in the buried channel may decrease slightly, the manufacturability of this process is far superior. In addition, the combination of buried channel devices and surface channel devices on the same wafer is enabled, since the local presence or absence of the implantation process will create a buried channel or surface channel device, respectively. Furthermore, buried channel devices can be created on the same wafer and within the same circuit with different thresholds by choosing the implant dose and type.

Figure 1A:
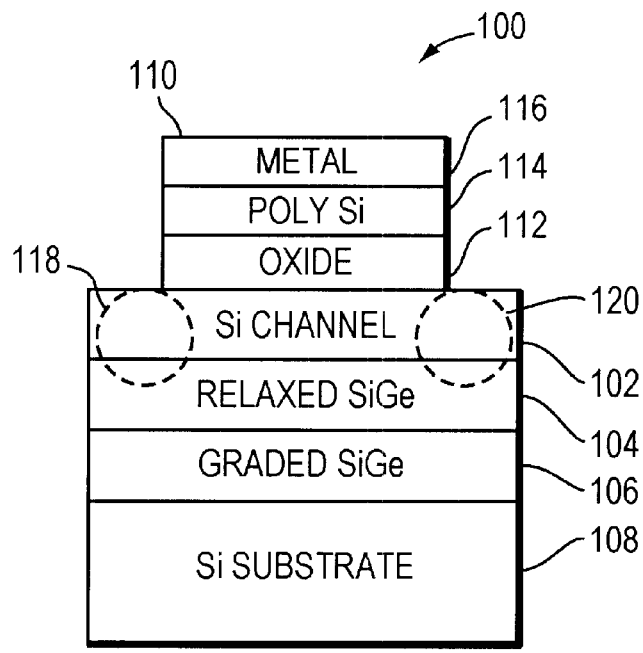
FIGS. 1A–1C are schematic block diagrams showing a variety of strained Si devices fabricated with relaxed SiGe buffer layers.
Figure 1B:
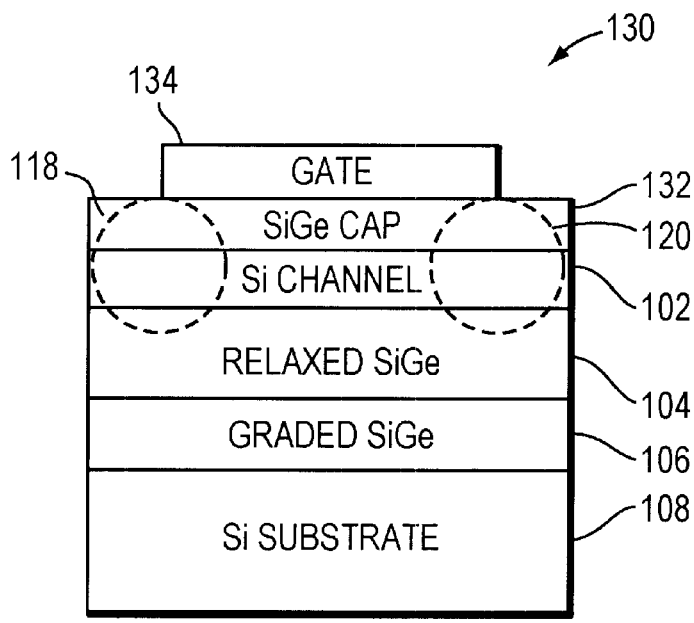
Figure 1C:
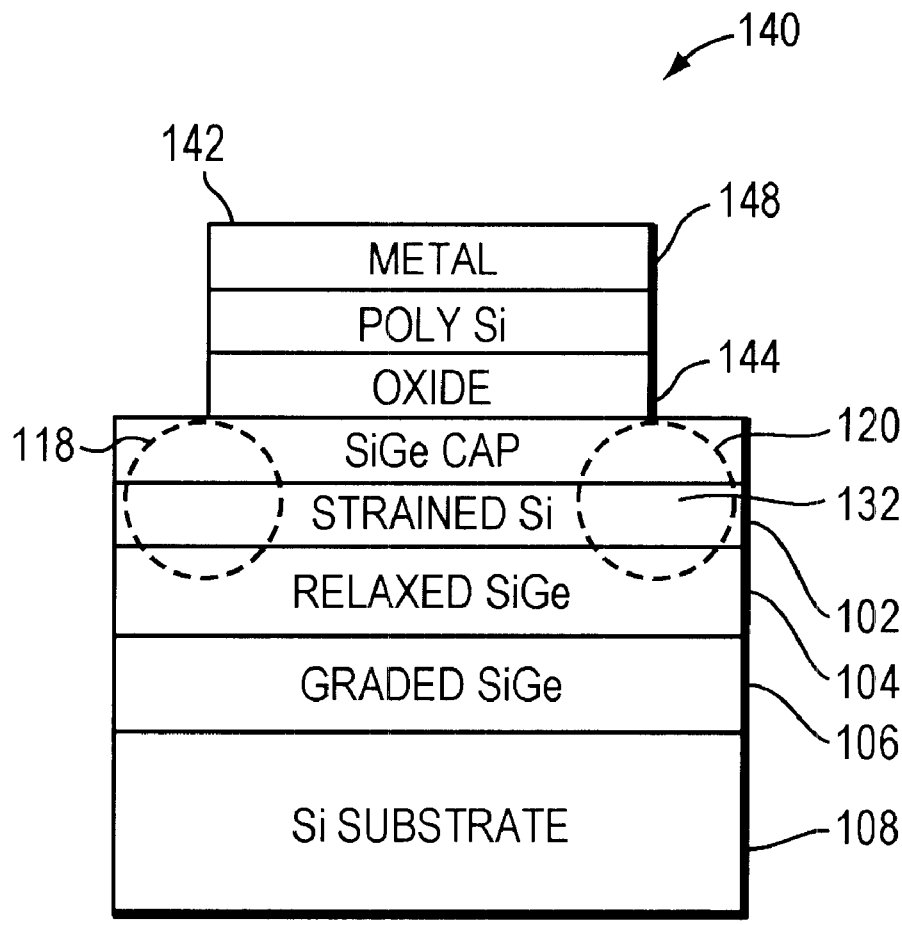
Figure 2A:
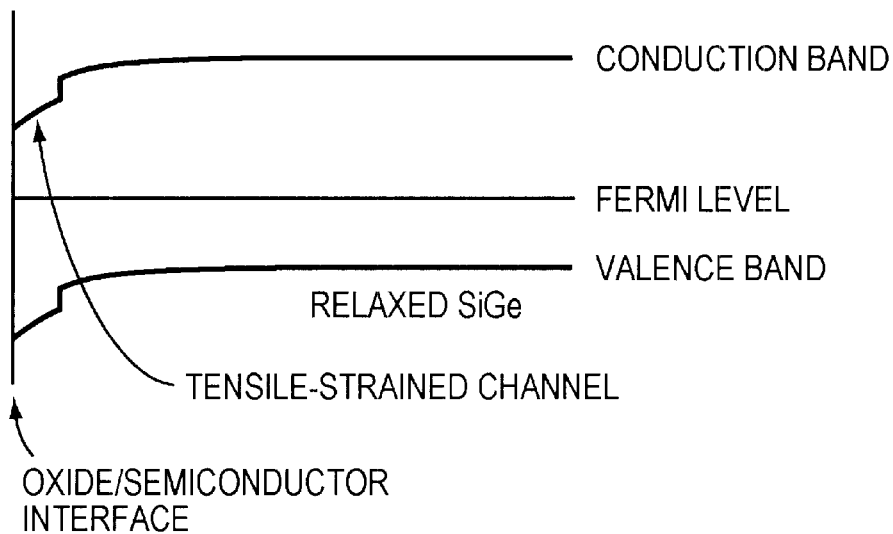
FIGS. 2A and 2B are the energy band diagram for the case of the surface channel FET for an NMOS device, at zero bias, and at a bias to turn on the transistor, respectively.
Figure 2B:
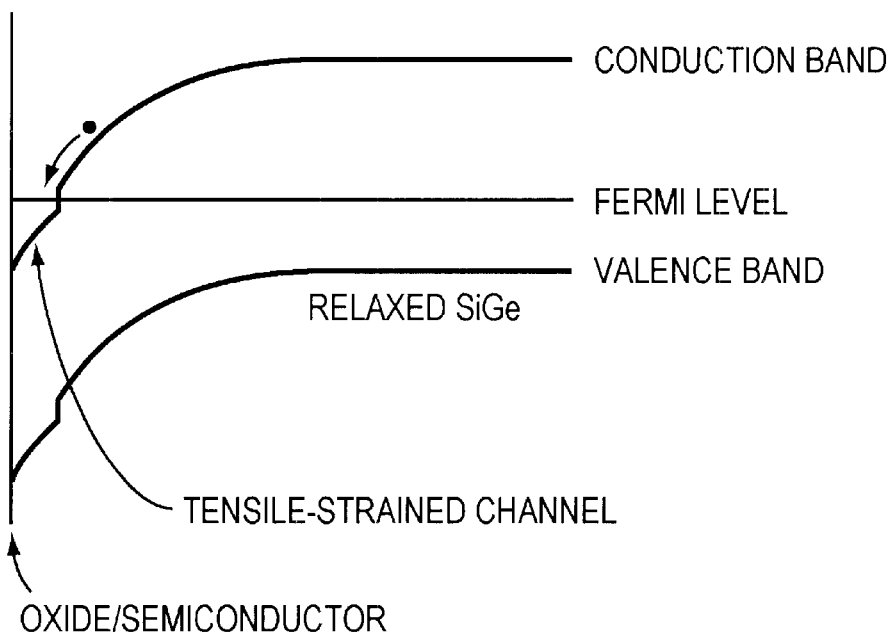
Figure 3:
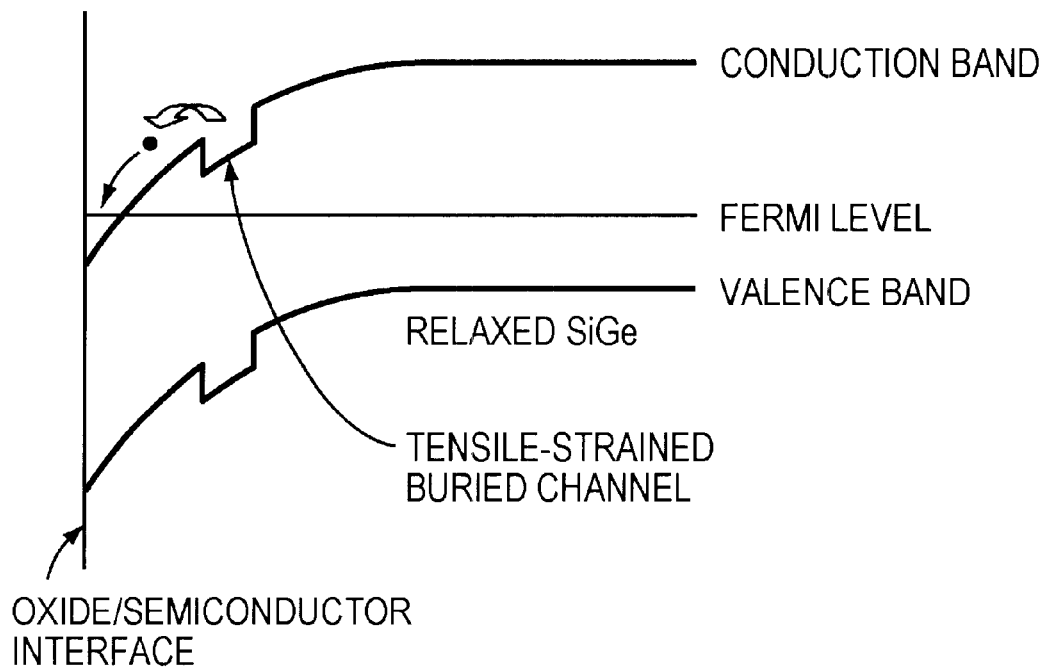
FIG. 3 is an energy band diagram showing schematically the problem with a buried channel device in which there is no dopant supply layer.
Figure 4A:
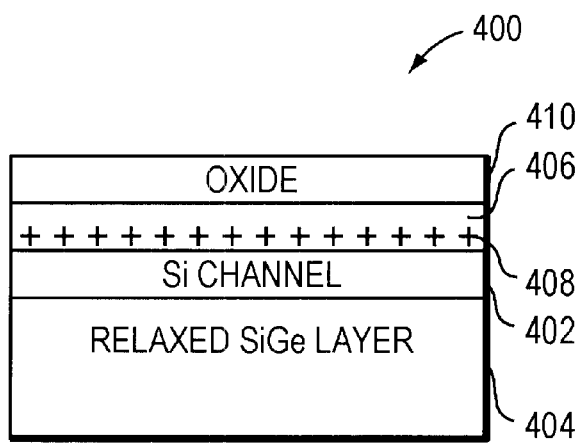
FIG. 4A is a schematic block diagram of a structure in which the buried channel can be occupied with a high density of electrons via the insertion of a layer of donor atoms.
Figure 4B:
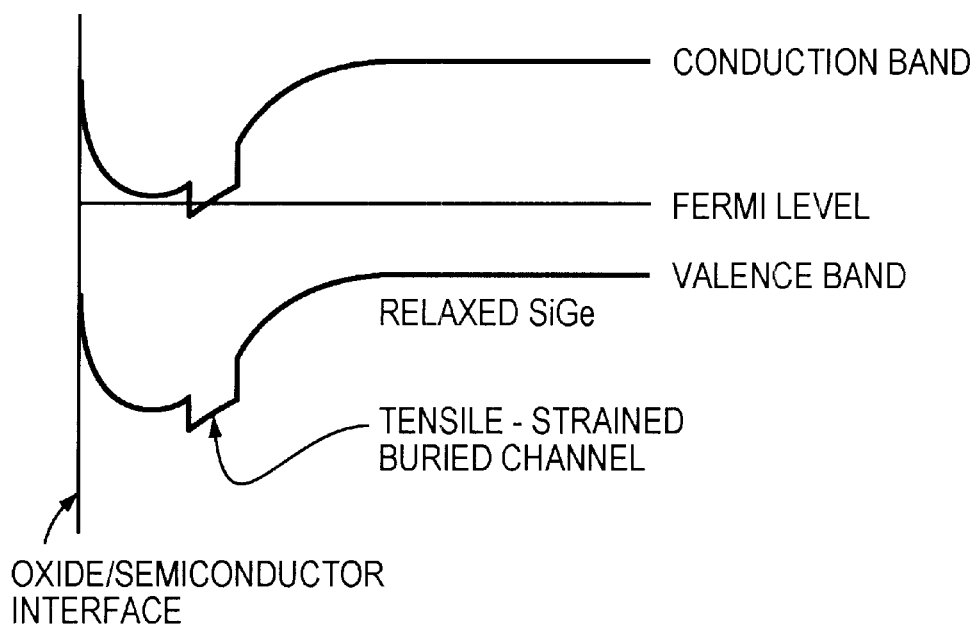
FIG. 4B is the energy band diagram for the structure of FIG. 4A.
Figure 6:
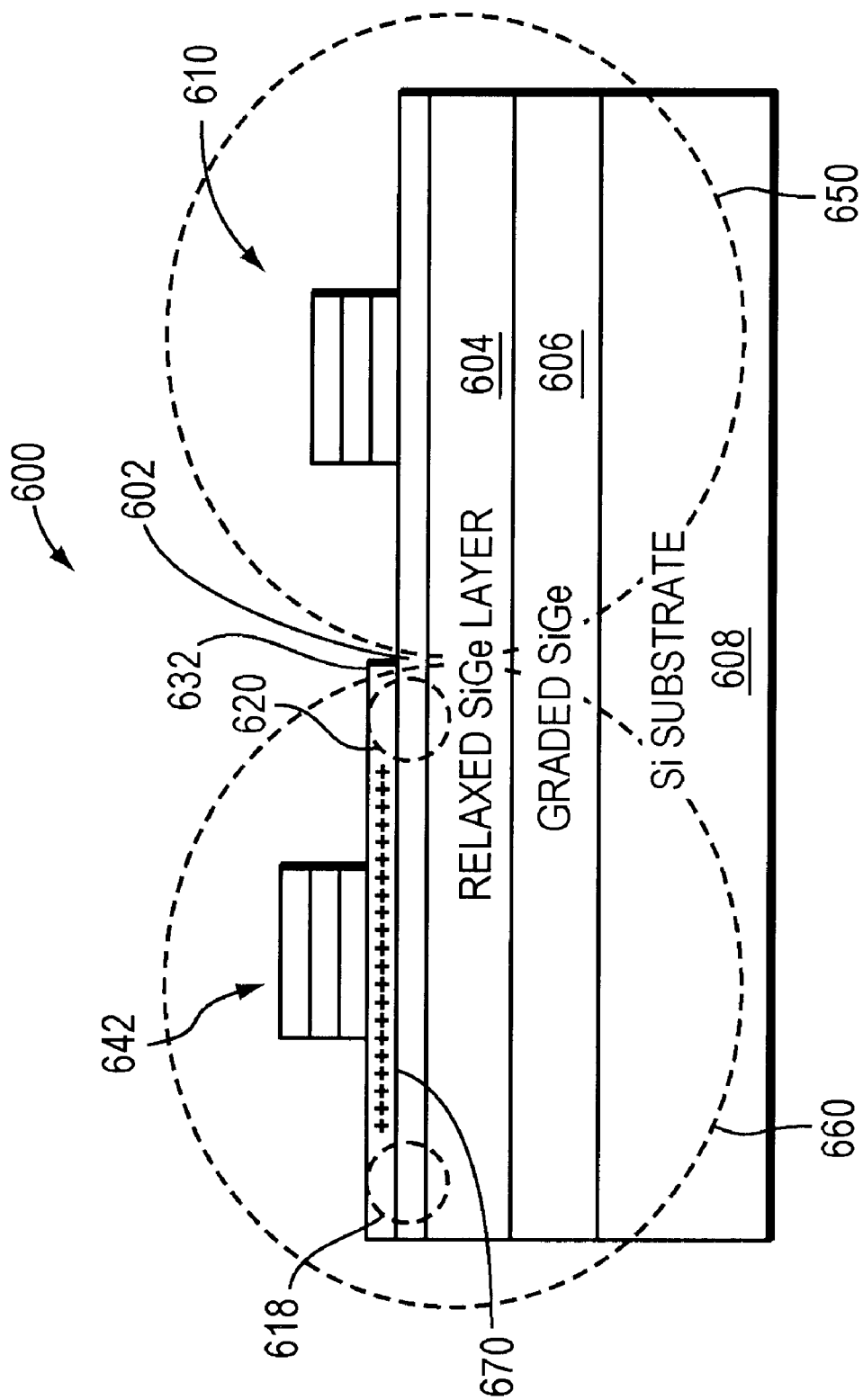
FIG. 6 is a schematic block diagram of a structure in which both a surface channel device and buried channel device are configured next to each other on a processed Si/SiGe heterostructure on a Si substrate.

An example is shown in FIG. 6 that shows a structure 600 in which both a surface channel device 650 and buried channel device 660 are configured next to each other on a processed Si/SiGe heterostructure on a Si substrate 608. The elements of the buried channel device are the same as shown in FIG. 1C while the elements of the surface channel device are the same as shown in FIG. 1A. The depletion mode, buried channel device results from the incorporation of a dopant supply implant 670. Other devices on the wafer, like the enhancement mode device 650, can be masked off and not receive the supply implant. The SiGe cap layer can be removed 632, if desired, forming surface channel enhancement mode strained Si devices in these regions. In the case where the dopant supply layer is grown epitaxially and embedded in the wafer from the beginning, integration of conventional MOS devices with the buried channel device is difficult, since the MOS devices must not contain the dopant supply layer.

The ability to mix these devices on a common chip area is a great advantage when creating system-on-chip applications. For example, the low noise performance and high frequency performance of the buried channel devices suggest that ideal applications are first circuit stages that receive the electromagnetic wave in a wireless system. The ability to form such devices and integrate them with surface channel MOS devices shows an evolutionary path to system-on-chip designs in which the entire system from electromagnetic wave reception to digital processing is captured on a single Si-based chip.

In such a system, there is a trade-off in circuit design in passing from the very front-end that receives the electromagnetic signal to the digital-end that processes the information. In general, the front-end requires a lower level of complexity (lower transistor count), but a higher performance per transistor. Just behind this front-end, it may be advantageous (depending on the application) to design higher performance digital circuits to further translate the signal received by the front end. Finally, when the signal has been moved down to lower frequencies, high complexity MOS circuits can be used to process the information. Thus, the buried channel MOSFET has an excellent application in the very front-end of analog/digital systems. The buried channel MOSFET will offer low noise performance and a higher frequency of operation than conventional Si devices.

Figure 7:
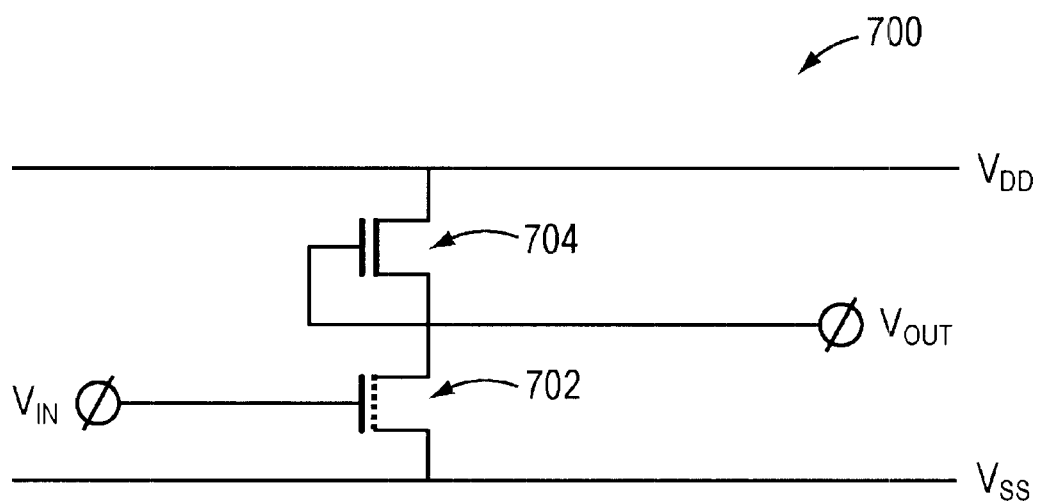
FIG. 7 is a schematic diagram of an inverter utilizing enhancement mode and depletion mode devices as shown in FIG. 6.

For just behind the front-end, in some applications it may be desirable to have high-performance logic. In FIG. 6 the surface channel device 650 is an enhancement-mode device (turned off without applied gate bias) and the buried channel device 660 can be a depletion-mode device (turned on without applied gate voltage) or an enhancement mode device, depending on the implant conditions. Thus, the device combination shown in FIG. 6 can be used to create enhancement-depletion logic, or E/D logic. An example of an inverter 700 using this combination of devices is shown in FIG. 7. The E/D inverter 700 is virtually identical to a typical CMOS inverter, but utilizes enhancement mode 702 and depletion mode 704 devices rather than NMOS and PMOS devices. This fundamental unit of digital design shows that the process described herein is critical in creating high performance circuits for analog applications such as wireless applications and high-speed electronic circuitry.

The enhanced performance is directly related to the mobility of the carriers in the strained Si and the low noise figure of the buried channel device. The enhanced mobility will increase the transconductance of the field effect transistor. Since transconductance in the FET is directly related to power-delay product, logic created with this E/D coupling of the strained devices described herein can have a fundamentally different power-delay product than conventional Si CMOS logic. Although the architecture itself may not be as low power as conventional CMOS, the lower power-delay product due to strained Si and/or buried channels can be used either to increase performance through higher frequency operation, or to operate at lower frequencies while consuming less power than competing GaAs-based technologies. Moreover, since the devices are based on a Si platform, it is expected that complex system-on-chip designs can be accommodated at low cost.

Figure 8A:
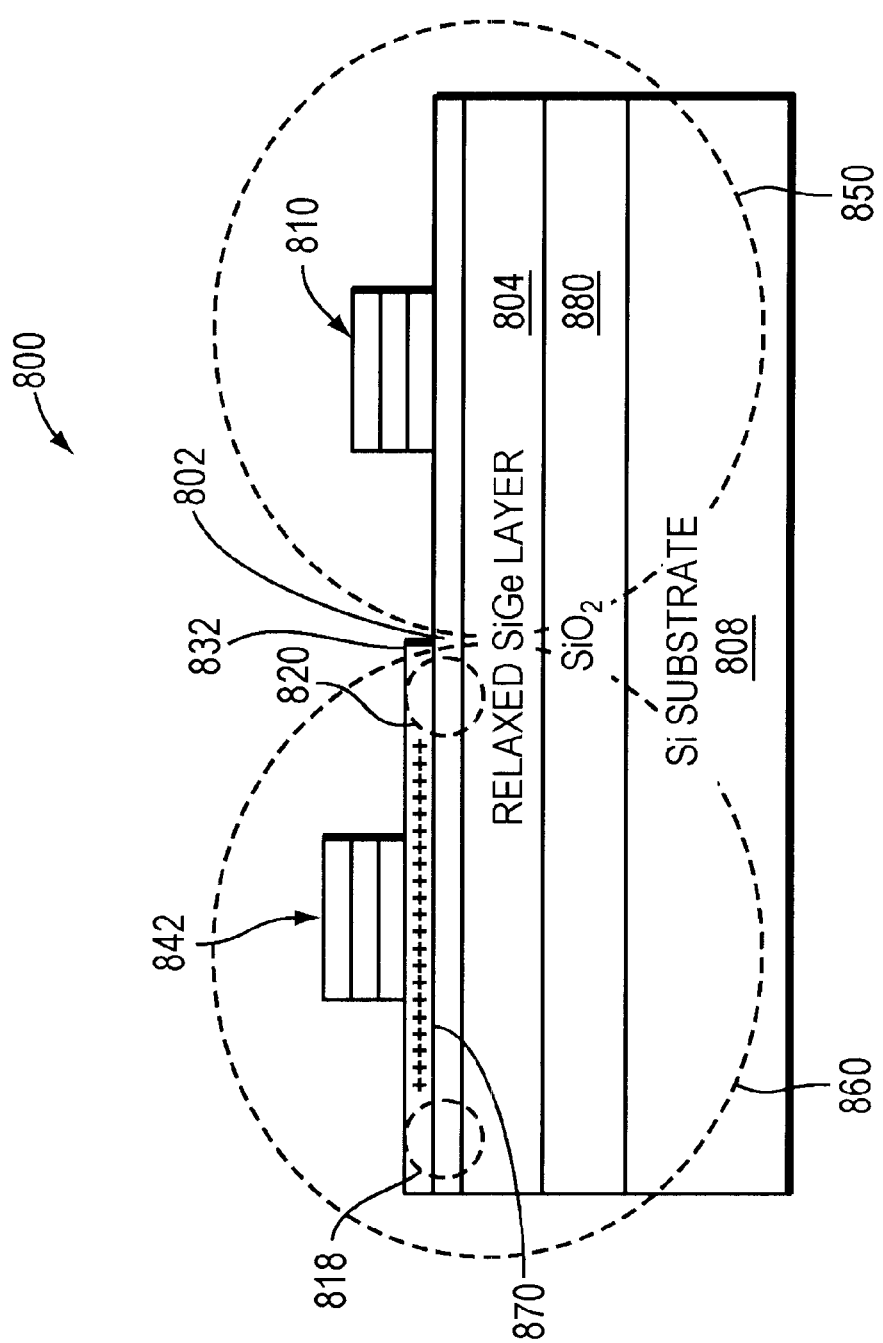
FIG. 8A is a schematic block diagram of a structure utilizing the implanted dopant supply layer on buried oxide technology.

To achieve an even lower power-delay product in the devices, it is possible to employ this process on strained-Si/relaxed SiGe on alternative substrates, such as $SiO_2/Si$ or insulating substrates. FIG. 8A is a schematic block diagram of a structure 800 utilizing the implanted dopant supply layer on buried oxide technology. FIG. 8A shows the same types of devices and elements depicted in FIG. 6 processed on a slightly different substrate. This substrate, a hybrid of relaxed SiGe and SOI substrates, incorporates a buried $SiO_2$ layer 880 beneath a thin layer of relaxed SiGe 804. Just as with the relaxed SiGe platform illustrated FIG. 6, strained Si devices can be formed atop this new substrate. The buried oxide layer provides the advantages of a SOI-like substrate, including lower power consumption and decreased junction leakage.

Figure 8B:
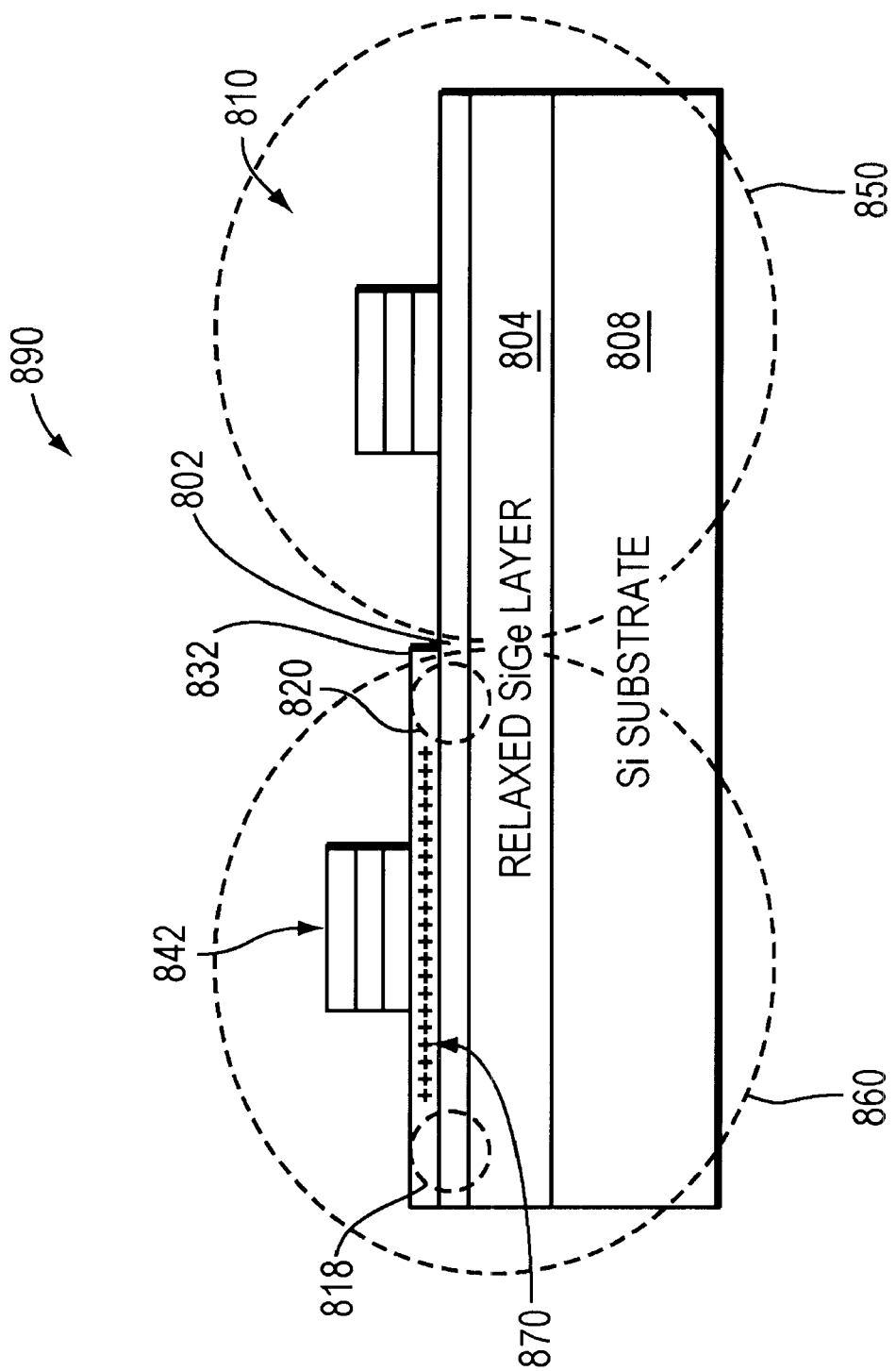
FIG. 8B is a schematic block diagram of a structure utilizing the implanted dopant supply layer without the use of a buried $SiO_2$ layer.

If the substrate shown in FIG. 8A does not have a buried $SiO_2$ layer, then the structure 890 shown in FIG. 8B is produced. This embodiment is useful in high power applications where the low thermal conduction of a SiGe graded buffer (FIG. 6) or an oxide layer (FIG. 8A) leads to the accumulation of heat in the resulting circuit.

Since the mobility in the buried channel can be in the range of 1000–2900 $cm^2$/V-sec, and the mobility of the surface channel can be as high as 400–600 $cm^2$/V-sec, the power-delay product in a conventional Si E/D design will be much larger than the power-delay product for the strained-Si E/D design. Thus, analog chips containing high performance strained Si devices using the ion implant methodology will have a significantly lower power-delay product, which means the chips can have higher performance in a wide-range of applications.

Figure 9:
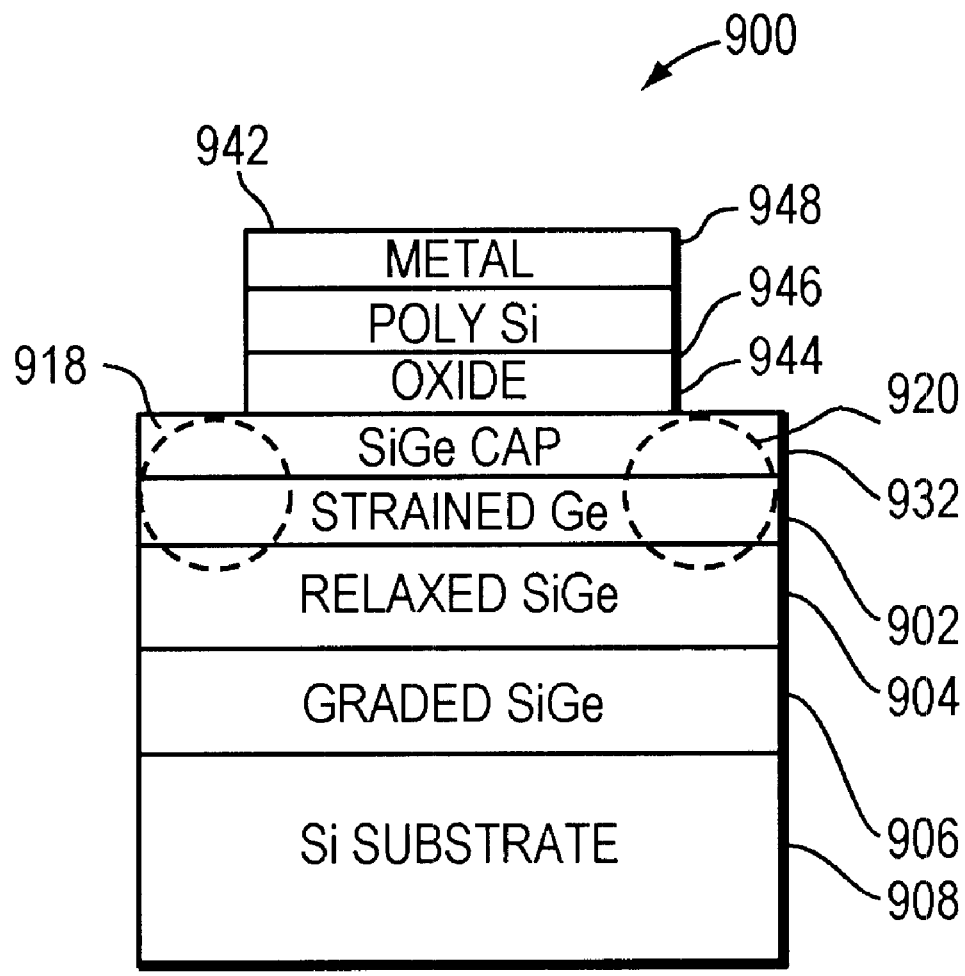
FIG. 9 is a schematic block diagram of a buried Ge channel MOSFET.

The exemplary embodiments described have focused on the use of ion implantation in strained Si devices; however, the benefits of ion implantation can also be realized in surface and buried channel strained Ge devices. FIG. 9 is a schematic block diagram of a buried Ge channel MOSFET 900. In this embodiment, a relaxed SiGe layer 904 has a Ge concentration in the range of 50–90% Ge. The higher Ge concentration in the relaxed SiGe layer is necessary to ensure that the thickness of the Ge channel 902, which is compressively strained, is not limited by critical thickness constraints. In FIG. 9, the relaxed SiGe layer is shown on a SiGe graded buffer layer 904 on a Si substrate 908. However, the layer can be directly on a Si substrate or a Si substrate coated with $SiO_2$. Like the Si buried channel device, the MOSFET contains a SiGe cap layer 932, usually with a similar Ge concentration as the relaxed SiGe layer, a gate stack 942 containing oxide 944, poly-Si 946 and metal 948 layers, and doped source 918 and drain 920 drain regions at each end of the gate. The ion implanted dopant supply layer can be introduced into either the SiGe cap layer or the relaxed SiGe layer.

In summary, the ion-implantation methodology of forming the dopant supply layer allows the creation of a manufacturable buried channel MOSFET or MODFET. The methodology also has the advantage that process flows can be created in which depletion-mode transistors can be fabricated by local implantation, but other nearby devices can be shielded from the implant or implanted with different doses/ impurities, leading to enhancement-mode devices. Co-located enhancement and depletion mode devices can further be utilized to create simple digital building blocks such as E/D-based logic. Thus, the invention also leads to additional novel high-performance Si-based circuits that can be fabricated in a Si manufacturing environment.

Although the present invention has been shown and described with respect to several preferred embodiments thereof, various changes, omissions and additions to the form and detail thereof, may be made therein, without departing from the spirit and scope of the invention.

What is claimed is:

1. A method of fabricating a buried channel FET, the method comprising the steps of:
   providing a relaxed SiGe layer on a substrate;
   providing a channel layer adjacent said relaxed SiGe layer;
   providing a SiGe cap layer adjacent said channel layer; and
   ion implanting a dopant supply in at least one of the relaxed SiGe layer and the SiGe cap layer so as to extend along said channel at least between source and drain regions thereof.

2. The method of claim 1, wherein the substrate comprises Si.

3. The method of claim 1, wherein the substrate comprises relaxed graded composition SiGe layers on Si.

4. The method of claim 1, wherein the substrate comprises Si with a layer of $SiO_2$.

5. The method of claim 1 further comprising forming a metal-oxide-semiconductor gate.

6. The method of claim 1, wherein the ion implanted dopant supply is in the SiGe cap layer.

7. The method of claim 1, wherein the ion implanted dopant supply is in the relaxed SiGe layer.

8. The method of claim 1, wherein the channel layer is under tensile strain.

9. The method of claim 1, wherein the channel layer is under compressive strain.

10. The method of claim 1, wherein the ion implanted dopant supply comprises As, P, Sb, B, Ga, or In.

11. The method of claim 8, wherein the relaxed SiGe layer has a Ge concentration in the range of 10–50%.

12. The method of claim 11, wherein the channel layer comprises Si.

13. The method of claim 12, wherein the ion implanted dopant supply comprises P, As, or Sb.

14. The method of claim 9, wherein the relaxed SiGe layer has a Ge concentration in the range of 50–90%.

15. The method of claim 14, wherein the channel layer comprises Ge.

16. The method of claim 15, wherein the ion implanted dopant supply comprises B, Ga, or In.

17. The method of claim 1, wherein the channel layer has a thickness between 2 and 30 nm.

18. The method of claim 1, wherein the SiGe cap layer has a thickness between 2 and 20 nm.

19. The method of claim 1 further comprising forming an integrated circuit.

20. The method of claim 1 further comprising interconnecting to a surface channel FET.

21. A method of fabricating a buried channel MOSFET, the method comprising the steps of:
   providing a relaxed SiGe layer on a substrate;
   providing a channel layer adjacent said relaxed SiGe layer;
   providing a SiGe cap layer adjacent said channel layer;
   providing a gate dielectric above said SiGe cap layer; and
   ion implanting a dopant supply in at least one of the SiGe cap layer and the relaxed SiGe layer so as to extend along said channel at least between source and drain regions thereof.

22. The method of claim 21, wherein the substrate comprises Si.

23. The method of claim 21, wherein the substrate comprises relaxed graded composition SiGe layers on Si.

24. The method of claim 21, wherein the substrate comprises Si with a layer of $SiO_2$.

25. The method of claim 21, wherein the relaxed SiGe layer has a Ge composition in the range of 10–50%.

26. The method of claim 25, wherein the channel layer comprises Si.

27. The method of claim 26, wherein the ion implanted dopant supply comprises P, As, or Sb.

28. The method of claim 21 further comprising forming an integrated circuit.

29. The method of claim 21 further comprising interconnecting to a surface channel MOSFET.

30. A method of fabricating a circuit comprising:
    providing at least one strained channel, enhancement mode FET and at least one strained channel, depletion mode FET on a substrate, the FETs each comprising a source and a drain; and
    ion implanting a dopant supply in said depletion mode FET, the dopant supply spanning said channel at least between said depletion mode FET source and said depletion mode FET drain.

31. The method of claim 30, wherein the enhancement mode FET is a MOSFET.

32. The method of claim 30, wherein the depletion mode FET is a MOSFET.

33. The method of claim 30, wherein the enhancement mode FET is a surface channel MOSFET.

34. The method of claim 33, wherein the depletion mode FET is a buried channel MOSFET.

35. The method of claim 30, wherein the depletion mode FET is a surface channel MOSFET.

36. The method of claim 30, wherein the enhancement mode FET is a buried channel MOSFET.

37. The method of claim 30, wherein the depletion mode FET is a buried channel MOSFET.

38. The method of claim 30, wherein the circuit is an inverter.

39. The method of claim 30, wherein the enhancement mode FET and the depletion mode FET are interconnected to form an inverter.

40. A method of fabricating an inverter comprising:
    providing a strained buried channel depletion mode FET and a strained surface channel enhancement mode FET on a substrate, the FETs each comprising a source and a drain; and
    ion implanting a dopant supply in said strained buried channel depletion mode FET, the dopant supply spanning said channel at least between said depletion mode FET source and said depletion mode FET drain.

41. The method of claim 40 further comprising forming an integrated circuit.

42. A method of fabricating an inverter comprising:
    providing a strained buried channel depletion mode MOSFET and a strained surface channel enhancement mode MOSFET on a substrate; and
    ion implanting a dopant supply in said strained buried channel depletion mode MOSFET.

43. The method of claim 42 further comprising forming an integrated circuit.

* * * * *